United States Patent [19]

Hayashi

[11] Patent Number: 4,801,976
[45] Date of Patent: Jan. 31, 1989

[54] COPYING DEVICE FOR COPYING AN IMAGE ON A PHOTO-PRESSURE SENSITIVE SHEET

[75] Inventor: Shigeyuki Hayashi, Nagoya, Japan

[73] Assignee: Brother Kogyo Kabushiki Kaisha, Aichi, Japan

[21] Appl. No.: 114,050

[22] Filed: Oct. 29, 1987

[30] Foreign Application Priority Data

Oct. 31, 1986 [JP] Japan ............... 61-261427

[51] Int. Cl.$^4$ ............................................. G03B 29/00
[52] U.S. Cl. ...................................................... 355/28
[58] Field of Search ................... 355/3 R, 8, 14 C, 18, 355/40, 55, 60, 69, 75, 77, 27, 28, 29; 430/138, 211

[56] References Cited

U.S. PATENT DOCUMENTS

| 2,751,814 | 6/1956 | Limberger | 355/28 |
| 4,211,482 | 7/1980 | Arai et al. | 355/8 |
| 4,399,209 | 8/1983 | Sanders et al. | 430/138 |
| 4,440,846 | 4/1984 | Sanders et al. | 430/138 |
| 4,624,560 | 11/1986 | Beery | 355/27 |
| 4,627,708 | 12/1986 | Arai et al. | 355/57 X |
| 4,655,583 | 4/1987 | Kitai et al. | 355/29 |

FOREIGN PATENT DOCUMENTS 2050012 11/1971 Fed. Rep. of Germany ........ 355/29

Primary Examiner—Donald A. Griffin
Attorney, Agent, or Firm—Parkhurst, Oliff & Berridge

[57] ABSTRACT

According to the present apparatus, a photo-pressure sensitive paper includes thereon a chromogenic material and photo-sensitive composition etc., and microcapsules which cure in response to light. The paper is fed onto an exposure table. The unexposed microcapsules on the paper are ruptured so that the chromogenic material and photo-sensitive composition etc., which flows therefrom reacts with a developing agent provided on either the paper or a transfer sheet where the image is formed. Responsive to the detected magnification during exposure, the paper is exposed from the leading edge thereof.

3 Claims, 4 Drawing Sheets

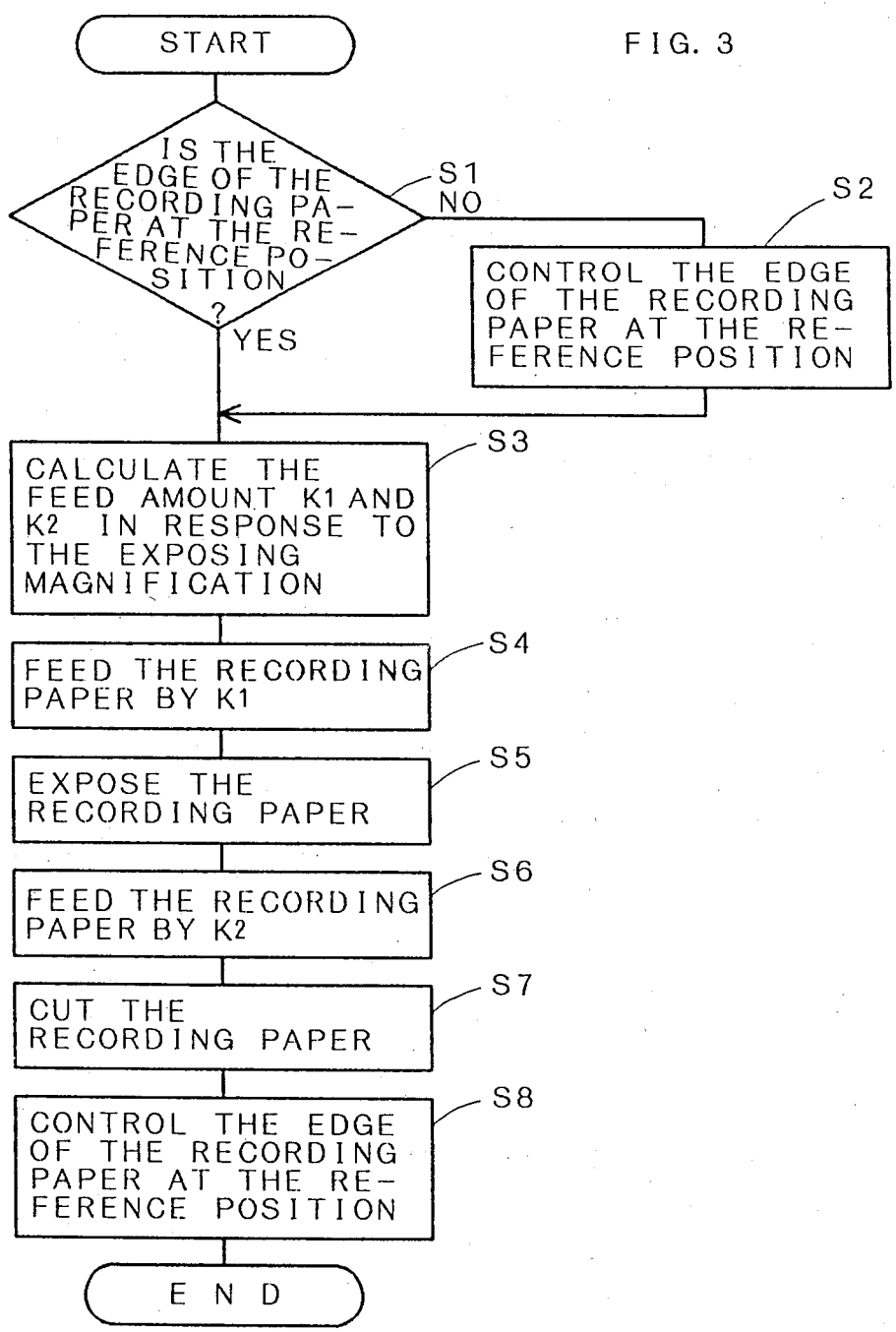

COPYING DEVICE FOR COPYING AN IMAGE ON A PHOTO-PRESSURE SENSITIVE SHEET

BACKGROUND ART

The present invention relates to a copying apparatus for developing an image on a photo-pressure sensitive sheet.

A conventional copying apparatus, such as a developing apparatus for a photograph, reader printer for a microfilm and so on, exposes a photo-sensitive paper to the light transmitted through or reflected from an original, and develops the exposed paper so that an image of the original is formed thereon. In this kind of apparatus, however, a unique chemical agent is used to develop the exposed paper so that the construction of the developing apparatus is complicated. Recently, the copy machine using a photo-pressure sensitive paper, such as U.S. Pat. Nos. 4,440,846 and 4,399,209 and Copending U.S. patent application Nos. 024,432 filed on Mar. 11, 1987 and 943,195 filed on Dec. 18,1986 have been proposed. To elaborate, it is provided with microcapsules which contain a chromogenic material and photo-sensitive composition etc., and are cured by light.

Upon completion of exposure, the photo-pressure sensitive paper is pressed by a press roller to rupture the microcapsules which are not cured. The chromogenic material and photo-sensitive composition etc., accordingly flows from the ruptured microcapsules and the chromogenic material reacts with a developing agent coated on either the photo-pressure sensitive paper or a transfer sheet where the image of the object will be formed. As a result, the construction of the copying apparatus can be simplified. The photo-pressure sensitive paper, however, must be handled with utmost care because the microcapsules may be ruptured by an outside force. In addition, if a cut sheet of a predetermined size is used, it is difficult to fit the sheet into the copying apparatus, and a feeding apparatus for the cut sheets is complicated. In order to solve the above problem, the inventor realized that the photo-pressure sensitive paper can form a roll. Accordingly, attachment to the apparatus can be simplified; and long continuous usage is possible once it is attached; the sheet can be fed simply by a roller and so on. However, there exists another problem as follows. When the copier is so constructed that an exposure magnification of the image on the recording paper is set at will, an exposure area and an exposure position of the image vary in response to the selected magnification of exposure. Since the conventional copy apparatus always feeds a sheet a predetermined length, it is impossible to expose the recording sheet from the edge thereof in all cases, resulting in wasteful use of paper.

SUMMARY OF THE INVENTION

The object of the present invention is to provide a copying apparatus in which the exposure magnification is set freely and the paper is always exposed from the leading edge thereof.

In accordance with the present invention, a copying apparatus comprising: a photo-pressure sensitive sheet M1 coated with at least a plurality of microcapsules which encapsulate chromogenic material and photo-sensitive composition etc., each microcapsule cures in response to exposing to light; exposure means M3 for exposing on the photo-pressure sensitive sheet arranged on an exposure position M2 for forming a latent image on the photo-pressure sensitive sheet in response to an original image by the curing of the microcapsules; feeding means M4 for feeding the photo-pressure sensitive sheet onto the exposure position; developing means M5 for rupturing the uncured microcapsules on the photo-pressure sensitive sheet and for forming a visible image; magnification detection means M6 for detecting degree of the magnification of the image exposed by the exposing means; and, exposure area control means M7 for controlling said feeding means in response to degree of the magnification detected by the detection means whereby the photo-pressure sensitive sheet is exposed by said exposing means from a leading edge thereof.

BRIEF DESCRIPTION OF THE DRAWINGS

Other objects and features of the invention will become apparent to those skilled in the art as disclosure is made in the following description of a preferred embodiment of the present invention, as illustrated in the accompanying sheet of drawings, in which:

FIG. 3 is a flowchart executed by a control circuit of the present embodiment;

DETAILED DESCRIPTION OF THE PREFERRED EMBODIMENT

The present invention, intending to obviate the above-mentioned disadvantages, will be explained below with reference to an embodiment thereof shown in the accompanying drawings.

Figure 1:
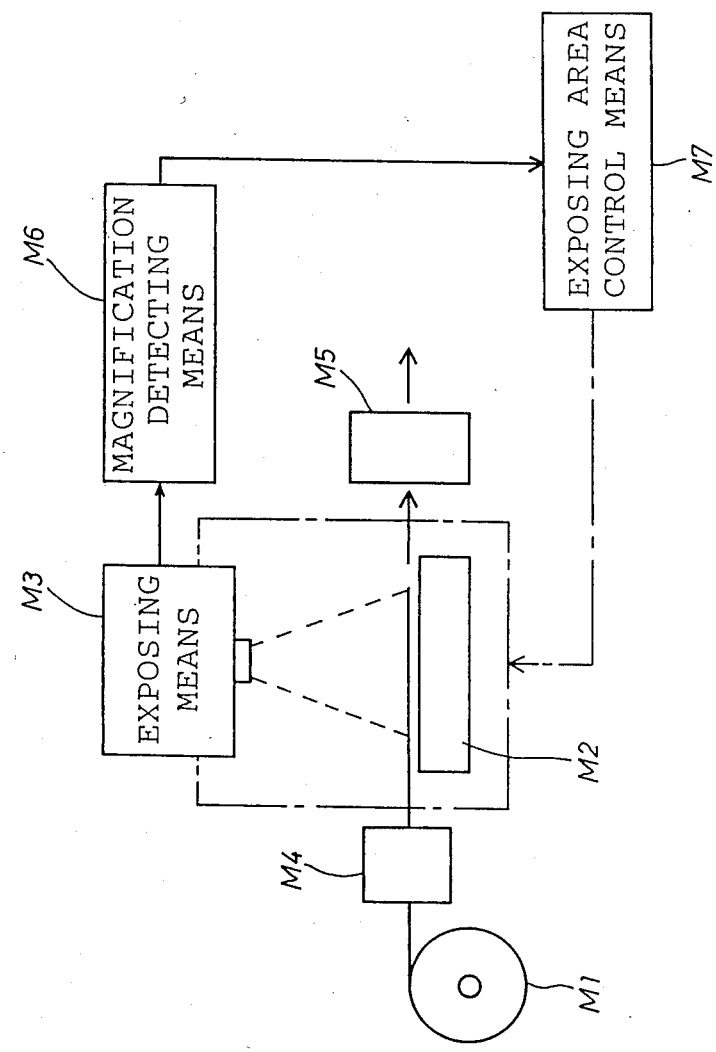
FIG. 1 is a block diagram illustrating a construction of the present invention.
Figure 2:
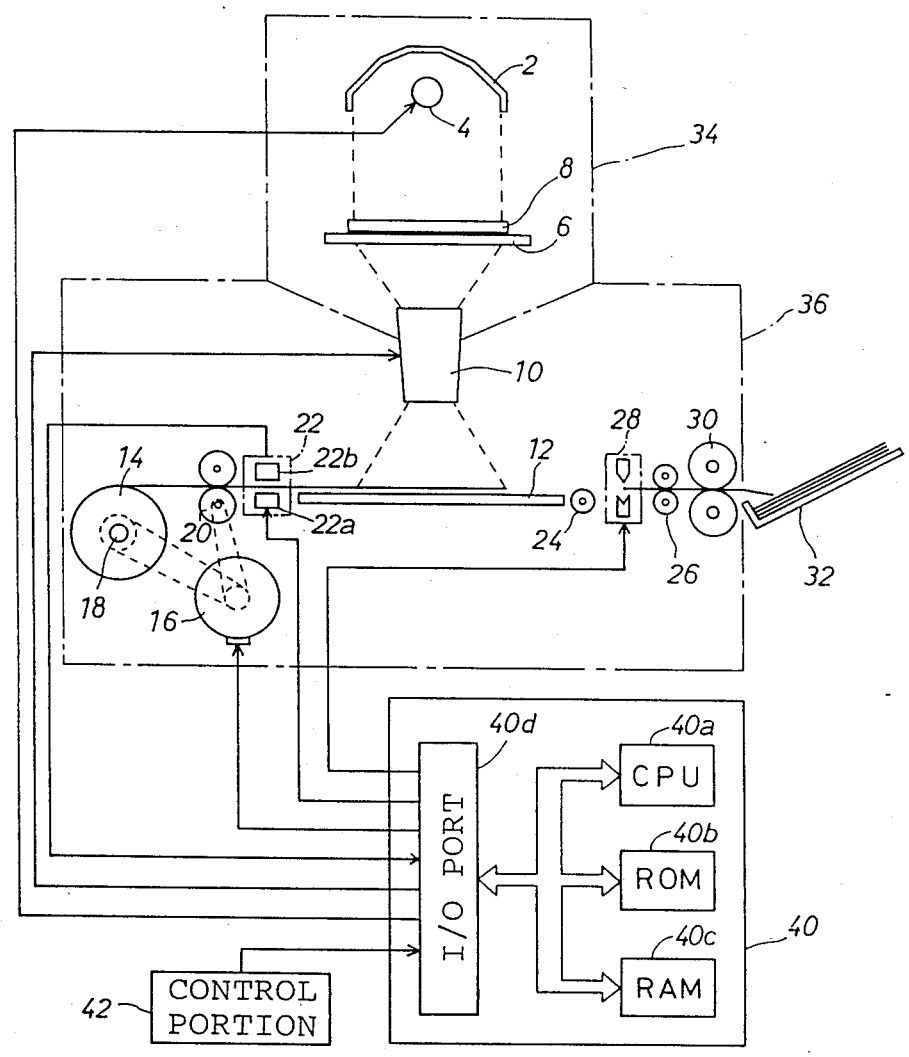
FIG. 2 is a detailed construction of a copier of an embodiment according to the present invention.

Referring to FIG. 2, in a copying apparatus of the present embodiment, a light source 4 is provided with a reflecting plate 2 in the rear thereof, and an original 8 of a light permeable type is placed on a transparent paper support 6. Light from the light source 4 strikes the original 8 and passes through a zoom lens 10. This light next impinges on an exposure table 12 thereby exposing a photo-pressure sensitive recording paper 14 on which microcapsules and a developing agent are provided. A chromogenic material and photo-sensitive composition etc.,, enclosed in the microcapsules which become cured in response to light, and the chromogenic material reacts with the developing agent, resulting in an autogenic color development. The paper 14 forms a continuous roll.

A motor 16 rotates a rotational shaft 18 and pairs of feeding rollers 20 so that the paper 14 rolled around the rotational shaft 18 is fed by the feeding rollers 20. Along the feeding path are the exposure table 12 and a position sensor 22 which senses the leading edge of the paper 14 with respect to the downstream edge of exposure table 12. A feeding path after exposure is provided by pinch rollers 24 and 26, a cutter 28 which cuts an exposed length of the paper 14, press rollers 30 which press and develop the paper 14 cut by the cutter 28, and a receiving tray 32 which receives the developed paper 14. Pinch rollers 24 and 26 and the press roller 30 are constantly rotated while the developing apparatus is operational.

The feeding rollers 20 feed the paper 14 by pressing both faces of the paper therebetween lightly enough as not to rupture the microcapsules on the paper 14 by pressure. The light path from the light source 4 to the zoom lens 10, and the feeding path between the paper 14 and the receiving tray 32, are covered with shielding walls 34 and 36, respectively, as outlined by a dotted chain line, so as to block outer light from reaching and exposing the paper 14. The position sensor 22 comprises an emitting unit 22a including two light-emitting elements provided at the lower face of the paper 14 along the feeding direction, and a receiving unit 22b including two light-receiving elements provided at the upper face of the paper 14 in opposition to the emitting unit 22a. Two beams are generated by activating both light-emitting elements of the emitting unit 22a. When only one of the light receiving elements of the receiving unit 22b adjacent to the exposing table 12 receives the beam, the leading edge of the paper 14 is detected to be at a reference position.

The above-mentioned light source 4, the zoom lens 10, the motor 16, the position sensor 22 and the cutter 28 are connected to an input/output port 40d of a control circuit 40 comprising a CPU 40a, a ROM 40b and a RAM 40c. In accordance with instructions from a control unit 42, the control circuit 40 executes steps in the developing process. More specifically, a magnification by zoom lens 10 is controlled by the control circuit 40 in response to a development magnification of the original as instructed by the control unit 42, i.e., the exposure magnification of the paper 14. Furthermore, the control circuit 40 controls feeding, exposure, cutting action, etc., in response to the instructions from the control unit 42.

Referring to FIG. 3, steps in this development are hereinafter described. Upon starting the developing process at step S1, it is determined whether or not the leading edge of the paper 14 is located at the reference position. If the determination is NO at step S1, the leading edge of the paper 14 is positioned at the reference position by activating the motor 16 at step S2. As described above, two beams are generated by activating both light-emitting elements. When the edge of the paper 14 is located at the reference position, only one light receiving element of the receiving unit 22b adjacent to the exposing table 12 receives a beam and outputs a receiving signal. Thus, the edge of the paper 14 is determined to be at the reference point. If the edge is not at the reference point, the paper 14 is fed through the feeding rollers 20 driven by the motor 16 until only one receiving signal is output from the light-receiving unit adjacent to the position sensor 22.

After steps S1 and S2, processing steps proceeds to step S3 where feed amounts K1 and K2 are determined in response to the exposure magnification determined by the magnification control. K1 represents the amount of the paper 14 fed onto the exposing table 12 just before the exposure, and K2 represents the amount of the paper 14 fed from the moment of exposure until it is cut by the cutter 28. The exposure are (lighted area) on the exposing table 12 is varied in accordance with the magnification produced by the zoom lens 10, thereby varying the position of exposure region of the light beamed through the original. As a result of the determination of K1, the paper 14 is exposed from the leading edge thereof. Moreover, as a result of the determination of K2, the exposed length of paper 14 is precisely cut off by the cutter 28.

At subsequent step S4, the paper 14 is fed the feed amount K1 onto the exposing table 12, and at step S5 the paper 14 is exposed by activating the light source 4. At subsequent step S6, the paper 14 is fed the feed amount K2, and at step S7 the paper 14 is cut by the cutter 28. Finally, at step S8, the leading edge of the paper 14 is controlled to move into the reference position.

Figure 4A:
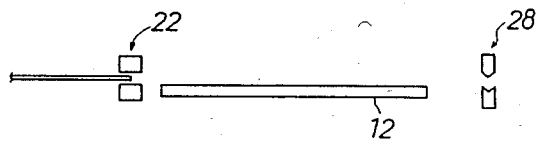
FIGS. 4A through 4D are explanatory views illustrating feeding and cutting actions in a developing process of the present embodiment.
Figure 4B:
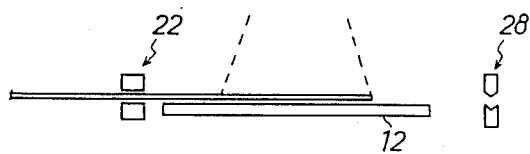
Figure 4C:
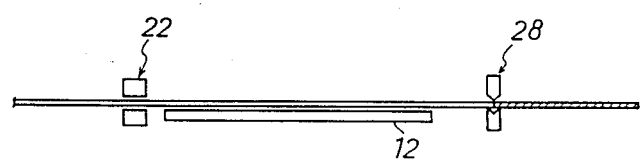
Figure 4D:
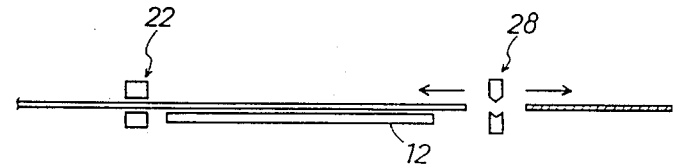

Referring to FIGS. 4A through 4D, the edge of the paper 14 is located at the reference position as shown in FIG. 4A; fed the feed amount K1 onto the exposing table 12; exposed by activating the light source 4 as shown in FIG. 4B; and fed by the feed amount K2 as shown in FIG. 4C. The exposed part of the paper 14 is precisely cut off by the cutter 28 in FIG. 4D. Finally, the leading edge of the paper 14 is controlled to be located at the reference position as shown in FIG. 4A.

Figure 5A:
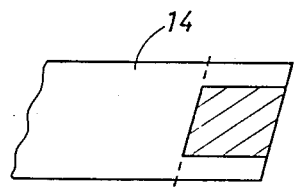
FIGS. 5A and 5B are explanatory views illustrating an exposed condition of a photo-pressure sensitive paper in response to an exposure magnification.
Figure 5B:
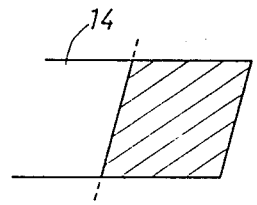

According to the present embodiment, as shown in FIGS. 5A and 5B which show the paper 14 with its exposed area hatched, the leading edge of the paper 14 is always controlled to be at the starting point of exposure, regardless of the magnification selected. After exposure, the exposed area is cut off as shown by a dotted line, and then developed by the press roller 30.

It will be noted that the light-reflecting type developing apparatus may be used instead of above light-permeating type. Moreover, instead of varying the feed amount K1, K1 may be kept constant and the edge of the permeating light closest to the press roller 30 may be kept in the reference position by controlling the position of the original support 6, the light source 4 and the reflecting plate 2. Furthermore, instead of the autogenic-developing sheet, the transfer-type photo-pressure sensitive sheet without the developing agent may be used together with a transfer sheet coated with the developing agent. Both sheets are pressed together and the chromogenic material transfers to the transfer sheet to reacts with the developing agent whereby, the image is developed on the transfer sheet.

Obviously, many modifications and variations of the present invention are possible in the light of the above teachings. It is therefore to be understood that within the scope of the appended claims, the invention may be practiced otherwise than as specifically described.

What is claimed is:

1. A copying apparatus comprising:
  a photo-pressure sensitive sheet coated with at least a plurality of microcapsules which encapsulate: chromogenic material which reacts with a developing agent coated on one of said photo-pressure sensitive sheet and a transfer sheet; and photo-sensitive composition, wherein the mechanical strength of each microcapsule varies in response to exposure to light;
  exposing means for exposing said photo-pressure sensitive sheet arranged on an exposure position for forming a latent image on one of said photo-pressure sensitive sheet and said transfer sheet in response to an original image;
  feeding means for feeding one of said photo-pressure sensitive sheet and said transfer sheet onto said exposure position;
  developing means for rupturing said microcapsules of weak mechanical strength, for reacting said chromogenic material effused from said microcapsules with said developing agent, and for forming a visible image;

magnification detection means for detecting a degree of the magnification of said image exposed by said exposing means; and exposure area control means for controlling said feeding means in response to said degree of the magnification detected by said detection means, whereby said photo-pressure sensitive sheet is exposed by said exposing means from a leading edge thereof.

2. A copying apparatus comprising:

a photo-pressure sensitive sheet coated with at least a plurality of microcapsules which encapsulate: chromogenic material which reacts with a developing agent coated on one of said photo-pressure sensitive sheet and a transfer sheet; and photo-sensitive composition, wherein the mechanical strength of each microcapsule varies in response to exposure to light;

exposing means for exposing said photo-pressure sensitive sheet arranged on an exposure position for forming a latent image on one of said photo-pressure sensitive sheet and said transfer sheet in response to an original image;

control amount computing means for computing said exposure position, a first feed amount corresponding to a first distance from a reference position to said exposure position, and a second feed amount corresponding to a second distance from said exposure position to a cut position in response to a degree of magnification of said image;

feeding means for feeding one of said photo-pressure sensitive sheet and said transfer sheet to said exposure position and said cut position;

developing means for rupturing said microcapsules of weak mechanical strength and for forming a visible image;

cutting means for cutting one of said photo-pressure sensitive sheet and said transfer sheet at said cut position; and feed control means for controlling said feeding means in response to said exposure position, said first feed amount and said second feed amount, whereby said photo-pressure sensitive sheet is exposed by said exposing means from a leading edge thereof and one of said transfer sheet and said photo-pressure sensitive sheet are cut by said cutting means at said cut position.

3. A copying apparatus according to claim 2 further comprising reference feed control means responsive to said exposure position, said first feed amount, and said second feed amount for controlling one of said photo-pressure sensitive sheet and said transfer sheet at said reference position.

* * * * *